(12) United States Patent
McNamara et al.

(10) Patent No.: US 6,369,641 B1
(45) Date of Patent: Apr. 9, 2002

(54) BIASING CIRCUITS

(75) Inventors: Brian J. McNamara, Haverhill, MA (US); Heinz Banzer, Grafing; Ludger Verweyen, Munich, both of (DE)

(73) Assignee: Infineon Technologies North America Corp., San Jose, CA (US)

( * ) Notice: Subject to any disclaimer, the term of this patent is extended or adjusted under 35 U.S.C. 154(b) by 0 days.

(21) Appl. No.: 09/668,439

(22) Filed: Sep. 22, 2000

(51) Int. Cl.[7] .................................................. H01J 19/82
(52) U.S. Cl. ........................................ 327/532; 327/330
(58) Field of Search ................................. 327/531, 532, 327/551, 330, 587; 363/44, 45, 47, 48

(56) References Cited

U.S. PATENT DOCUMENTS

| | | | |
|---|---|---|---|
| 4,208,595 A | 6/1980 | Gladstein et al. | 307/297 |
| 4,631,421 A | 12/1986 | Inoue et al. | 307/297 |
| 4,733,108 A | 3/1988 | Truong | 307/296 R |
| 5,559,471 A | 9/1996 | Black | 330/277 |
| 5,578,961 A | 11/1996 | Fajen et al. | 327/543 |
| 5,771,470 A | 6/1998 | Nimmo et al. | 455/572 |

*Primary Examiner*—Jung Ho Kim

(57) ABSTRACT

In one aspect, a bias circuit includes a rectifier, a negative bias level setter, and a negative bias extractor. The rectifier has a rectifier input and a rectifier output. The rectifier is configured to produce at the rectifier output a negative rectified voltage signal from an alternating input signal applied at the rectifier input. The negative bias level setter couples to the rectifier output and provides a path for current establishing the negative rectified voltage signal produced at the rectifier output. The negative bias extractor has an extractor output and an extractor input coupled to the rectifier output. The negative bias extractor is configured to produce at the extractor output a substantially constant negative bias signal from the negative rectified voltage signal produced at the rectifier output. In another aspect, a bias circuit includes a biasing output coupled between a positive voltage source and a negative voltage source, and a switching circuit coupled between the positive voltage source and the biasing output. The switching circuit is configured to define two or more different current paths through the switching circuit and thereby produce two or more respective biasing states at the biasing output.

15 Claims, 3 Drawing Sheets

BIASING CIRCUITS

TECHNICAL FIELD

This invention relates to systems and methods for generating a negative bias.

BACKGROUND

In depletion mode devices, such as certain field effect transistors (FETs) and high electron mobility transistors (HEMTs), a conducting channel exists at zero gate bias, and a negative gate voltage is required to turn the device off. Such "normally on" devices are called depletion mode devices because gate voltage is used to deplete the channel that exists at equilibrium. For example, in a FET with an $n^+$ source and drain and a p-type substrate biased at zero volts, a channel (or depletion layer) exists between the FET terminals and the substrate. In some applications, the channel may be depleted and the FET turned off, by applying a negative bias between the gate and the substrate. In other applications, a negative bias may be applied to the FET substrate to reduce the body effect, decrease the depletion capacitance and increase the switching speed of the FET.

Many different circuits for producing a negative bias have been proposed. Both off-chip (or external) and on-chip negative bias circuits have been developed. A typical on-chip negative bias circuit for biasing resistive loads, such as the circuit substrate, includes a ring oscillator and a diode rectifier. A low pass filter typically is used with such on-chip circuits to reduce the ripple voltage produced at the output of the diode rectifier. Still other biasing circuits have been proposed.

SUMMARY

The invention features a scheme (systems and methods) for biasing high impedance loads (e.g., the input gate of a FET amplifier or a HEMT amplifier).

In one aspect, the invention features a bias circuit comprising a rectifier, a negative bias level setter, and a negative bias extractor. The rectifier has a rectifier input and a rectifier output. The rectifier is configured to produce at the rectifier output a negative rectified voltage signal from an alternating input signal applied at the rectifier input. The negative bias level setter couples to the rectifier output and provides a path for current establishing the negative rectified voltage signal produced at the rectifier output. The negative bias extractor has an extractor output and an extractor input coupled to the rectifier output. The negative bias extractor is configured to produce at the extractor output a substantially constant negative bias signal from the negative rectified voltage signal produced at the rectifier output.

Embodiments in accordance with this aspect of the invention may include one or more of the following features.

The negative bias level setter preferably is configured to substantially block the flow of current through the negative bias level setter current path during a positive cycle of the alternating input signal. The negative bias level setter may comprise a diode oriented for forward current flow toward the rectifier output. The negative bias level setter may further comprise a second diode coupled in series with the first diode and oriented for forward current flow toward the rectifier output. The negative bias level setter may further comprise a resister coupled in series with the diode.

The rectifier may comprise a diode coupled to the rectifier input and oriented for forward current flow away from the rectifier input. The rectifier may further comprise a second diode coupled to the rectifier input and oriented for forward current flow toward the rectifier input. The rectifier may comprise a transistor with a control terminal coupled to the rectifier input and oriented for forward current flow away from the rectifier input.

The negative bias extractor preferably comprises a capacitor coupled to the rectifier output in parallel with the negative bias level setter. The negative bias extractor may further comprise a resistor coupled between the rectifier output and the extractor output.

A capacitor may be coupled between the rectifier input and a source of the alternating input signal applied at the rectifier input.

In another aspect, the invention features a method of producing a bias. A negative rectified voltage signal is produced from an alternating input signal. A path for current establishing the negative rectified voltage signal is provided. A substantially constant negative bias signal is produced from the negative rectified voltage signal.

Embodiments in accordance with this aspect of the invention may include one or more of the following features.

The flow of current through the current path establishing the negative rectified voltage signal preferably is substantially blocked during a positive cycle of the alternating input signal. Charge preferably is stored during a negative cycle of the alternating input signal. The negative rectified voltage signal preferably is low pass filtered. A direct current component of the alternating input signal preferably is substantially blocked before producing the negative rectified voltage signal.

In another aspect, the invention features a bias circuit comprising a biasing output coupled between a positive voltage source and a negative voltage source, and a switching circuit coupled between the positive voltage source and the biasing output. The switching circuit is configured to define two or more different current paths through the switching circuit and thereby produce two or more respective biasing states at the biasing output.

Embodiments in accordance with this aspect of the invention may include one or more of the following features.

The switching circuit preferably is configured to define a relatively low resistance current path, a relatively high resistance current path, and a cutoff current path. The switching circuit preferably comprises a first switch coupled in series with a second switch and a resistor coupled across the current terminals of the first switch. The bias circuit may further comprise a stabilizer having an input that substantially tracks the bias level produced at the biasing output and a negative feedback path coupled to resist changes in the bias level produced at the biasing output. The stabilizer preferably comprises a transistor with a current terminal coupled between the positive voltage source and the biasing output and a control terminal coupled between the biasing output and the negative voltage source.

Among the advantages of the invention are the following.

The invention readily may be incorporated into a microwave monolithic integrated circuit (MMIC) to provide a negative voltage reference without any external components, such as large decoupling capacitors. The invention allows the source terminal of an active device (e.g., an RF FET amplifier) to be DC grounded. This feature increases the drain-source voltage swing of the active device, and improves the power and linearity performance of the active device. In addition, this feature reduces the number of bypassing components and the number of external connections needed to package and active device. The invention also enables different active device operating states to be selected dynamically using positive voltage controls. The inventive switchable bias circuit also improves the stability of the applied bias over variations in device characteristics (e.g., variations in threshold voltage and saturation current).

Other features and advantages of the invention will become apparent from the following description, including the drawings and the claims.

DETAILED DESCRIPTION

In the following description, like reference numbers are used to identify like elements. Furthermore, the drawings are intended to illustrate major features of exemplary embodiments in a diagrammatic manner. The drawings are not intended to depict every feature of actual embodiments or relative dimensions of the depicted elements, and are not drawn to scale.

Figure 1:
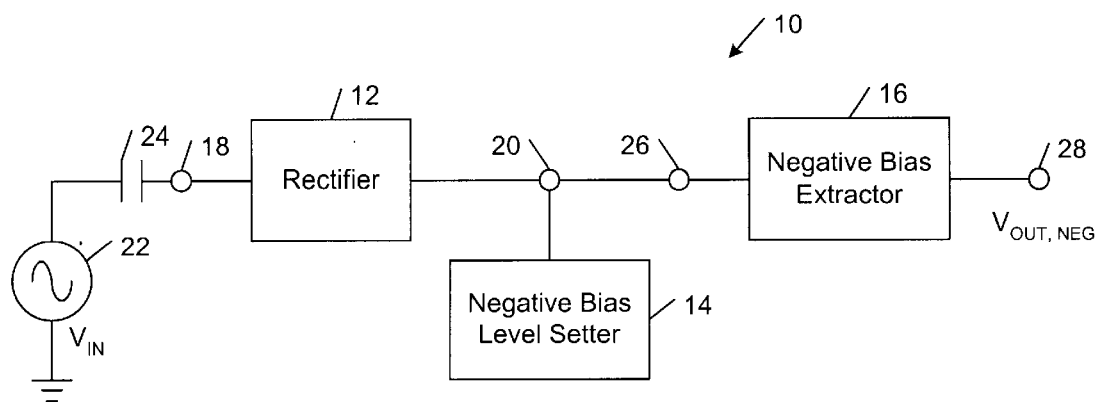
FIG. 1 is a block diagram of a negative bias circuit.

Referring to FIG. 1, a negative bias circuit 10 includes a rectifier 12, a negative bias level setter 14, and a negative bias extractor 16. Rectifier 12 has an input 18 and an output 20. Rectifier 12 is configured to produce at rectifier output 20 a negative rectified voltage signal from an alternating input signal ($V_{IN}$) applied to rectifier input 18 by an alternating voltage source 22. The alternating input signal may be a local oscillator input signal to a mixer or an RF input signal to a power amplifier. A DC blocking capacitor 24 substantially blocks a DC component of the alternating input signal ($V_{IN}$). Negative bias level setter 14 provides a path for current establishing the negative rectified voltage signal produced at rectifier output 20. Negative bias extractor 16 has an input 26 coupled to rectifier output 20 and an output 28 corresponding to the output of negative bias circuit 10. Negative bias extractor 16 is configured to produce at output 28 a substantially constant negative bias signal ($V_{OUT, NEG}$) from the negative rectified voltage signal produced at rectifier output 20.

Figure 2A:
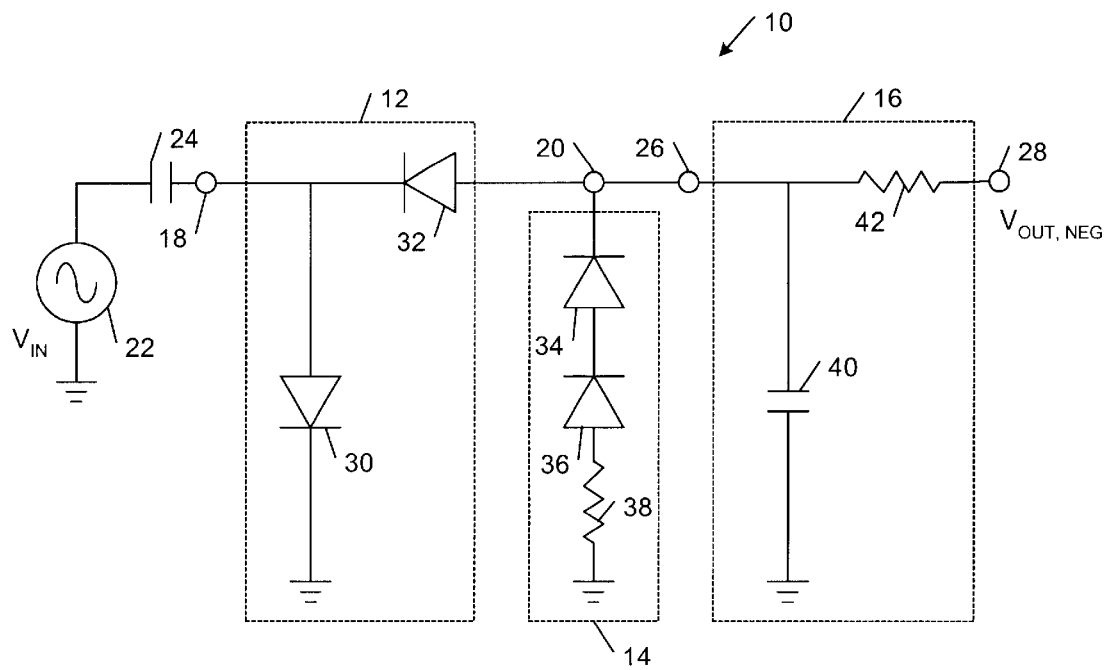
FIG. 2A is a circuit diagram of a negative bias circuit.

Referring to FIG. 2A, in one embodiment, rectifier 12 may be implemented by a pair of diodes 30, 32. Diode 30 is coupled to rectifier input 18 and is oriented for forward current flow away from rectifier input 18 (i.e., the diode anode is coupled to rectifier input 18 and the diode cathode is coupled to ground). Diode 32 is coupled to rectifier input 18 and is oriented for forward current flow toward rectifier input 18 (i.e., the diode anode is coupled is coupled to rectifier output 20 and the diode cathode is coupled to rectifier input 18). Negative bias level setter 14 may be implemented by one or more series connected diodes. In the embodiment of FIG. 2A, negative bias level setter 14 includes a pair of series connected diodes 34, 36 oriented for forward current flow toward rectifier output 20 and a resistor 38 coupled in series with diodes 34, 36. Negative bias extractor 16 may be implemented by a storage capacitor 40 coupled between input 26 and ground, and a resistor 42 coupled between extractor input 26 and extractor output 28.

In operation, during the positive cycle of the alternating input signal ($V_{IN}$), diode 30 clamps rectifier input 18 to approximately one diode drop (e.g., about 0.7 volts) and diode 32 is substantially non-conducting. During the negative cycle of the alternating input signal ($V_{IN}$), diode 30 is substantially non-conducting and diode 32 remains substantially non-conducting until the magnitude of the negative input signal supports current flow through diode 32 of rectifier 12 and diodes 34 and 36 of negative bias level setter 14. After the magnitude of the negative input signal exceeds approximately three diode drops (e.g., about 2.1 volts), negative bias level setter provides a path for current establishing a negative rectified voltage signal at rectifier output 20. Arbitrarily low negative voltages may be maintained because of the additional voltage drop that may be produced across resistor 38. For an input signal with a 3 volt peak-to-peak voltage swing, the voltage at rectifier input 18 may vary from approximately +0.7 volts to approximately −2.3 volts. Consequently, the voltage at rectifier output 20 may vary from approximately +0.7 volts to approximately −1.6 volts. Storage capacitor 40 and resistor 42 of negative bias extractor 16 smooth out the ripple (i.e., periodic variations in voltage about the steady state value) in the negative rectified voltage produced at rectifier output 26 to produce a substantially constant negative bias signal ($V_{NEG, OUT}$) at output 28. In some embodiments, resistor 42 serves to limit the peak output current. The capacitance value (C) of capacitor 40 preferably is selected so that:

$$R \cdot C \gg 1/f$$

where R is the resistance value of resistor 42 and f is the ripple frequency of the negative rectified voltage signal produced at rectifier output 20. In some other embodiments, resistor 42 may be omitted. The resulting negative bias signal ($V_{NEG, OUT}$) produced at output 28 has a substantially constant magnitude (e.g., approximately −1.6 volts).

Figure 2B:
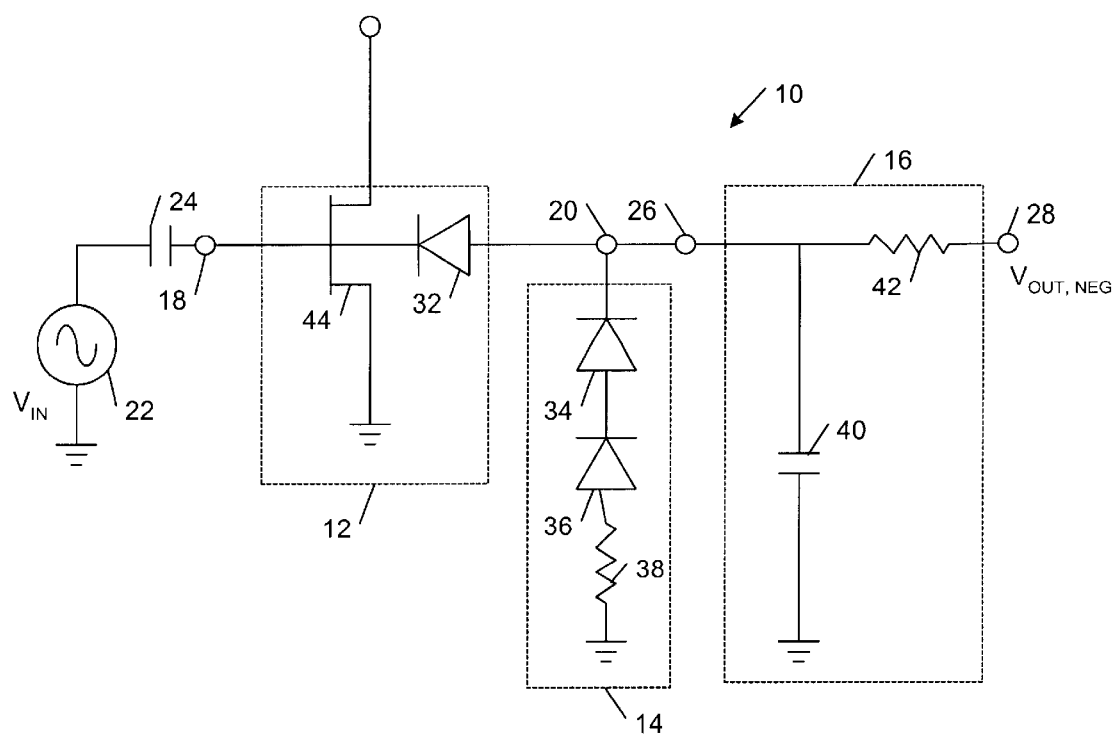
FIG. 2B is a circuit diagram of an alternative negative bias circuit.

As shown in FIG. 2B, in another negative bias circuit embodiment, diode 30 of rectifier 12 may be replaced by the gate-source diode of a transistor 44 (e.g., a FET) that may serve as an amplifier or a mixing element.

Figure 3:
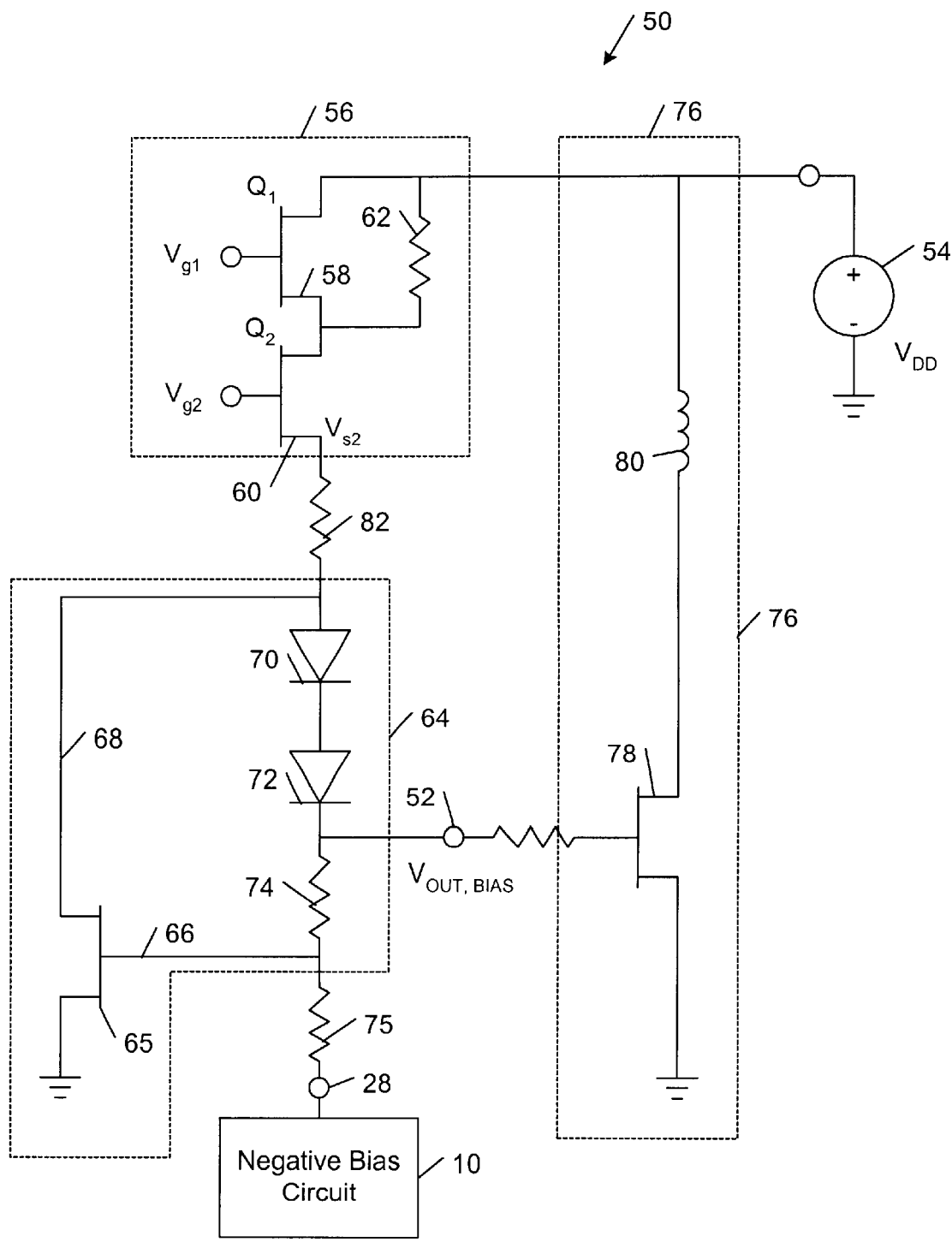
FIG. 3 is a circuit diagram of a switchable bias circuit.

Referring to FIG. 3, a switchable bias circuit 50 includes a biasing output 52 coupled between a positive voltage source 54 and a negative voltage source (e.g., the output 28 of negative bias circuit 10). Switchable bias circuit 50 includes a switching circuit 56 that is configured to define two or more different current paths producing two or more respective biasing states at biasing output 52. For example, in the present embodiment, switching circuit 56 is configured to define a relatively low resistance path, a relatively high resistance path, and a cutoff current path. Switching circuit 56 includes a first switch 58 ($Q_1$) with an input $V_{g1}$ coupled in series with a second switch 60 ($Q_2$) with an input $V_{g2}$, and a resistor 62 coupled across the current terminals of first switch 58. Switchable bias circuit 50 also includes a stabilizer 64 that has a transistor 65 with an input 66 that substantially tracks the bias level produced at biasing output 52 and a negative feedback transistor path 68 coupled to resist changes in the bias level produced at biasing output 52. Stabilizer 64 may include one or more level adjusting diodes. In the embodiment of FIG. 3, stabilizer 64 includes a pair of level adjusting diodes 70, 72 and a resistor 74, which reduces the operating sensitivity to variations in the negative bias signal ($V_{OUT, NEG}$) produced by negative bias circuit 10. A resistor 75 may be used to limit the current drain from negative bias circuit 10.

Switchable bias circuit 50 may be used to drive a high impedance load, such as the input of an RF amplifier 76 implemented by a FET transistor 78 and an inductor 80. In operation, switchable bias circuit may apply three different bias conditions to RF amplifier 76: a high current bias condition, a low current bias condition, and a cutoff current bias condition. The high current bias condition is set when both first switch 58 and second switch 60 are turned on. In this state, current flows through switches 58 and 60, substantially bypassing resistor 62, so that the resistance between positive voltage source 54 and biasing output 52 is dominated by a resistor 82. The low current bias condition is set by turning off switch 58 ($V_{g1} \approx 0$ volts) so that current flows primarily through resistor 62. This increases the voltage drop that occurs between positive voltage source 54 and biasing output 52 and, consequently, reduces the voltage level ($V_{OUT, BIAS}$) applied at biasing output 52. The cutoff current bias condition is set by turning off switch 60 ($V_{g2} \approx 0$ volts) so that current flow through switching circuit 56 is effectively, although not completely, cut off. In this state, the voltage at the source of Q2 ($V_{s2}$) will drop to approximately $V_{g2}$ plus the pinch off voltage for the device Q2. The voltage at $V_{OUT, BIAS}$ is then further reduced by the voltage drops across diodes 70, 72 such that the FET device 78 is strongly pinched off.

Stabilizer 64 counteracts variations in device characteristics (e.g., variations in threshold voltage and saturation current) that tend to cause fluctuations in current flow through FET 78. In particular, when such device variations operate to increase current flow though FET 78, they also operate to increase current flow through negative feedback transistor path 68. The increased current flow through negative feedback transistor path 68 reduces the voltage level applied at biasing output 52. The reduced biasing voltage reduces the operating current level of FET 78. Similarly, when such device variations operate to decrease current flow though FET 78, they also operate to decrease current flow through negative feedback transistor path 68. The decreased current flow through negative feedback transistor path 68 increases the voltage level applied at biasing output 52. The increased biasing voltage increases the operating current level of FET 78.

The diodes in each of the above-described embodiments may be implemented by FET or HEMT diodes or by a single junction of an active FET or HEMT device.

Other embodiments are within the scope of the claims.

What is claimed is:

1. A bias circuit, comprising:
    a rectifier having a rectifier input and a rectifier output and configured to produce at the rectifier output a negative rectified voltage signal from an alternating input signal applied at the rectifier input;
    a negative bias level setter coupled to the rectifier output and providing a path for current establishing the negative rectified voltage signal produced at the rectifier output; and
    a negative bias extractor having an extractor output and an extractor input coupled to the rectifier output, and being configured to produce at the extractor output a substantially constant negative bias signal from the negative rectified voltage signal produced at the rectifier output.

2. The bias circuit of claim 1, wherein the negative bias level setter is configured to substantially block the flow of current through the current path during a positive cycle of the alternating input signal.

3. The bias circuit of claim 1, wherein the negative bias level setter comprises a diode oriented for forward current flow toward the rectifier output.

4. The bias circuit of claim 3, wherein the negative bias level setter further comprises a second diode coupled in series with the first diode and oriented for forward current flow toward the rectifier output.

5. The bias circuit of claim 3, wherein the negative bias level setter further comprises a resister coupled in series with the diode.

6. The bias circuit of claim 1, wherein the rectifier comprises a diode coupled to the rectifier input and oriented for forward current flow away from the rectifier input.

7. The bias circuit of claim 6, wherein the rectifier further comprises a second diode coupled to the rectifier input and oriented for forward current flow toward the rectifier input.

8. The bias circuit of claim 1, wherein the rectifier comprises a transistor with a control terminal coupled to the rectifier input and oriented for forward current flow away from the rectifier input.

9. The bias circuit of claim 1, wherein the negative bias extractor comprises a capacitor coupled to the rectifier output in parallel with the negative bias level setter.

10. The bias circuit of claim 8, wherein the negative bias extractor further comprises a resistor coupled between the rectifier output and the extractor output.

11. The bias circuit of claim 1, further comprising a capacitor coupled between the rectifier input and a source of the alternating input signal applied at the rectifier input.

12. A bias circuit, comprising:
    a rectifier having a rectifier input and a rectifier output and comprising a first diode coupled to the rectifier input and oriented for forward current flow away from the rectifier input and a second diode coupled to the rectifier input and oriented for forward current flow toward the rectifier input;
    a negative bias level setter coupled to the rectifier output and comprising a diode oriented for forward current flow toward the rectifier output and a resistor coupled in series with the diode; and
    a negative bias extractor having an extractor output and an extractor input coupled to the rectifier output and comprising a capacitor coupled to the rectifier output in parallel with the negative bias level setter.

13. The bias circuit of claim 11, wherein the negative bias level setter further comprises a second diode coupled in series with the first diode and oriented for forward current flow toward the rectifier output.

14. The bias circuit of claim 11, wherein the negative bias extractor further comprises a resistor coupled between the rectifier output and the extractor output.

15. The bias circuit of claim 11, further comprising a capacitor coupled between the rectifier input and a source of the alternating input signal applied at the rectifier input.

\* \* \* \* \*